(12) United States Patent
Duff et al.

(10) Patent No.: US 7,954,449 B2
(45) Date of Patent: Jun. 7, 2011

(54) WIRING-FREE, PLUMBING-FREE, COOLED, VACUUM CHUCK

(75) Inventors: David G. Duff, Woodside, CA (US); Craig Eldershaw, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 1064 days.

(21) Appl. No.: 11/746,012

(22) Filed: May 8, 2007

(65) Prior Publication Data

US 2008/0277885 A1 Nov. 13, 2008

(51) Int. Cl.
*B23B 31/30* (2006.01)
(52) U.S. Cl. ............ 118/314; 118/300; 118/500; 279/3; 269/21
(58) Field of Classification Search .................. 118/322, 118/314
See application file for complete search history.

(56) References Cited

U.S. PATENT DOCUMENTS

| | | | |
|---|---|---|---|
| 2,031,387 A | 2/1936 | Schwarz | |
| 2,789,731 A | 4/1957 | Marraffino | |
| 3,032,008 A | 5/1962 | Land et al. | |
| 3,159,313 A | 12/1964 | Guilford | |
| 3,602,193 A | * 8/1971 | Adams et al. | 118/315 |
| 3,973,994 A | 8/1976 | Redfield | |
| 3,988,166 A | 10/1976 | Beam | |
| 4,018,367 A | * 4/1977 | Morine et al. | |
| 4,021,267 A | 5/1977 | Dettling | |
| 4,045,246 A | 8/1977 | Mlavsky et al. | |
| 4,053,327 A | 10/1977 | Meulenberg, Jr. | |
| 4,084,985 A | 4/1978 | Evans, Jr. | |
| 4,086,485 A | 4/1978 | Kaplow et al. | |
| 4,095,997 A | 6/1978 | Griffiths | |
| 4,104,091 A | 8/1978 | Evans, Jr. et al. | |
| 4,119,058 A | * 10/1978 | Schmermund | |
| 4,131,485 A | 12/1978 | Meinel et al. | |

(Continued)

FOREIGN PATENT DOCUMENTS

CN 1346517 A 4/2002

(Continued)

OTHER PUBLICATIONS

Sparber et al. "Comparison of texturing methods for monocrystalline silicon solar cells using KOH and $Na_2CO_3$," $3^{rd}$ World Conf. Photovoltaic Energy Conversion, Osaka, 2003, pp. 1372-1375.

(Continued)

*Primary Examiner* — Parviz Hassanzadeh
*Assistant Examiner* — Charles J Capozzi
(74) *Attorney, Agent, or Firm* — Bever, Hoffman & Harms, LLP; Patrick T. Bever (57) ABSTRACT

A solar cell production system utilizes self-contained vacuum chucks that hold and cool solar cell wafers during transport on a conveyor between processing stations during a fabrication process. Each self-contained vacuum chuck includes its own local vacuum pump and a closed-loop cooling system. After each wafer is processed, it is removed from its vacuum chuck, and the vacuum chuck is returned to the start of the production line by a second conveyor belt. In one embodiment, each vacuum chuck includes an inductive power supply that is inductively coupled to an external source to drive that vacuum chuck's vacuum pump and cooling system. An optional battery is recharged by the inductive power supply, and is used to power the vacuum pump and cooling system during hand-off between adjacent processing stations.

10 Claims, 6 Drawing Sheets

U.S. PATENT DOCUMENTS

| | | | |
|---|---|---|---|
| 4,141,231 A * | 2/1979 | Kudlich | 68/205 R |
| 4,148,301 A | 4/1979 | Cluff | |
| 4,153,476 A | 5/1979 | Shelpuk et al. | |
| 4,177,083 A | 12/1979 | Kennedy | |
| 4,205,216 A | 5/1980 | Douglas | |
| 4,221,468 A | 9/1980 | Macken | |
| 4,223,202 A | 9/1980 | Peters et al. | |
| 4,224,081 A | 9/1980 | Kawamura et al. | |
| 4,254,894 A | 3/1981 | Fetters | |
| 4,331,703 A | 5/1982 | Lindmayer | |
| 4,337,758 A | 7/1982 | Meinel et al. | |
| 4,355,196 A | 10/1982 | Chai | |
| 4,461,403 A | 7/1984 | Prahs | |
| 4,476,165 A | 10/1984 | McIntyre | |
| 4,479,027 A | 10/1984 | Todorof | |
| 4,490,418 A | 12/1984 | Yoshida | |
| 4,521,457 A | 6/1985 | Russell et al. | |
| 4,533,814 A | 8/1985 | Ward | |
| 4,540,843 A | 9/1985 | Gochermann et al. | |
| 4,589,191 A | 5/1986 | Green et al. | |
| 4,602,120 A | 7/1986 | Wakefield et al. | |
| 4,609,037 A * | 9/1986 | Wheeler et al. | 165/61 |
| 4,683,348 A | 7/1987 | Pidgeon et al. | |
| 4,746,370 A | 5/1988 | Woolf | |
| 4,747,517 A | 5/1988 | Hart | |
| 4,792,685 A | 12/1988 | Yamakawa | |
| 4,796,038 A * | 1/1989 | Allen et al. | |
| 4,826,777 A | 5/1989 | Ondris | |
| 4,841,946 A | 6/1989 | Marks | |
| 4,847,349 A | 7/1989 | Ohta et al. | |
| 4,849,028 A | 7/1989 | Krause | |
| 4,855,884 A | 8/1989 | Richardson | |
| 4,896,015 A | 1/1990 | Taboada et al. | |
| 4,933,623 A * | 6/1990 | Fox | 322/25 |
| 4,938,994 A * | 7/1990 | Choinski | 427/96.1 |
| 4,947,825 A | 8/1990 | Moriarty | |
| 4,952,026 A | 8/1990 | Bellman et al. | |
| 4,996,405 A * | 2/1991 | Poumey et al. | 219/624 |
| 5,000,988 A | 3/1991 | Inoue et al. | |
| 5,004,319 A | 4/1991 | Smither | |
| 5,011,565 A | 4/1991 | Dube et al. | |
| 5,062,899 A | 11/1991 | Kruer | |
| 5,075,281 A * | 12/1991 | Testardi | |
| 5,089,055 A | 2/1992 | Nakamura | |
| 5,151,377 A | 9/1992 | Hanoka et al. | |
| 5,167,724 A | 12/1992 | Chiang | |
| 5,180,441 A | 1/1993 | Cornwall et al. | |
| 5,188,789 A | 2/1993 | Nishiura | |
| 5,213,628 A | 5/1993 | Noguchi et al. | |
| 5,216,543 A | 6/1993 | Calhoun | |
| 5,254,388 A | 10/1993 | Melby et al. | |
| 5,344,496 A | 9/1994 | Stern et al. | |
| 5,353,813 A | 10/1994 | Deevi et al. | |
| 5,356,488 A | 10/1994 | Hezel | |
| 5,389,159 A | 2/1995 | Kataoka et al. | |
| 5,449,413 A | 9/1995 | Beauchamp et al. | |
| 5,501,743 A | 3/1996 | Cherney | |
| 5,529,054 A | 6/1996 | Shoen | |
| 5,536,313 A * | 7/1996 | Watanabe et al. | |
| 5,538,563 A | 7/1996 | Finkl | |
| 5,540,216 A | 7/1996 | Rasmusson | |
| 5,543,333 A | 8/1996 | Holdermann | |
| 5,552,820 A | 9/1996 | Genovese | |
| 5,559,677 A | 9/1996 | Errichiello | |
| 5,560,518 A | 10/1996 | Catterall et al. | |
| 5,569,399 A | 10/1996 | Penney et al. | |
| 5,590,818 A | 1/1997 | Raba et al. | |
| 5,665,175 A | 9/1997 | Safir | |
| 5,700,325 A | 12/1997 | Watanabe | |
| 5,733,608 A | 3/1998 | Kessel et al. | |
| 5,751,436 A | 5/1998 | Kwon et al. | |
| 5,863,338 A * | 1/1999 | Yamada et al. | 118/719 |
| 5,873,495 A | 2/1999 | Saint-Germain | |
| 5,916,461 A | 6/1999 | Costin et al. | |
| 5,918,771 A | 7/1999 | van der Heijden | |
| 5,929,530 A | 7/1999 | Stone | |
| 5,949,123 A | 9/1999 | Le et al. | |
| 5,981,902 A | 11/1999 | Arita et al. | |
| 5,990,413 A | 11/1999 | Ortabasi | |
| 6,008,449 A | 12/1999 | Cole | |
| 6,011,307 A | 1/2000 | Jiang et al. | |
| 6,020,554 A | 2/2000 | Kaminar et al. | |
| 6,032,997 A | 3/2000 | Elliott et al. | |
| 6,047,862 A | 4/2000 | Davies | |
| 6,072,157 A * | 6/2000 | Klebanoff et al. | 219/228 |
| 6,091,017 A | 7/2000 | Stern | |
| 6,118,067 A | 9/2000 | Lashley et al. | |
| 6,130,465 A | 10/2000 | Cole | |
| 6,140,570 A | 10/2000 | Kariya | |
| 6,164,633 A | 12/2000 | Mulligan et al. | |
| 6,180,869 B1 | 1/2001 | Meier et al. | |
| 6,183,186 B1 * | 2/2001 | Howells et al. | 414/416.03 |
| 6,203,621 B1 * | 3/2001 | Tran et al. | 118/728 |
| 6,232,217 B1 | 5/2001 | Ang et al. | |
| 6,257,450 B1 | 7/2001 | Jackson et al. | |
| 6,274,508 B1 | 8/2001 | Jacobsen et al. | |
| 6,278,054 B1 | 8/2001 | Ho et al. | |
| 6,293,498 B1 | 9/2001 | Stanko et al. | |
| 6,310,281 B1 * | 10/2001 | Wendt et al. | |
| 6,323,415 B1 | 11/2001 | Uematsu et al. | |
| RE37,512 E | 1/2002 | Szlufcik et al. | |
| 6,351,098 B1 | 2/2002 | Kaneko | |
| 6,354,791 B1 | 3/2002 | Wytman et al. | |
| 6,379,521 B1 | 4/2002 | Nishio | |
| 6,398,370 B1 | 6/2002 | Chiu et al. | |
| 6,407,329 B1 | 6/2002 | Iino et al. | |
| 6,410,843 B1 | 6/2002 | Kishi et al. | |
| 6,413,113 B2 * | 7/2002 | Uher et al. | 439/372 |
| 6,418,986 B1 | 7/2002 | Gabriele | |
| 6,420,266 B1 | 7/2002 | Smith et al. | |
| 6,423,140 B1 | 7/2002 | Liu et al. | |
| 6,429,037 B1 | 8/2002 | Wenham et al. | |
| 6,459,418 B1 | 10/2002 | Comiskey et al. | |
| 6,479,395 B1 | 11/2002 | Smith et al. | |
| 6,527,964 B1 | 3/2003 | Smith et al. | |
| 6,531,653 B1 | 3/2003 | Glenn et al. | |
| 6,555,739 B2 | 4/2003 | Kawam | |
| 6,568,863 B2 | 5/2003 | Murata | |
| 6,590,235 B2 | 7/2003 | Carey et al. | |
| 6,597,510 B2 | 7/2003 | Bunkenburg et al. | |
| 6,623,579 B1 | 9/2003 | Smith et al. | |
| 6,663,944 B2 | 12/2003 | Park et al. | |
| 6,666,165 B2 | 12/2003 | Shiraishi et al. | |
| 6,667,434 B2 | 12/2003 | Morizane et al. | |
| 6,743,478 B1 | 6/2004 | Kiiha et al. | |
| 6,890,167 B1 | 5/2005 | Kwok et al. | |
| 6,896,381 B2 | 5/2005 | Benitez et al. | |
| 6,924,493 B1 * | 8/2005 | Leung | |
| 6,979,798 B2 | 12/2005 | Gu et al. | |
| 7,002,675 B2 * | 2/2006 | MacGibbon et al. | 356/237.2 |
| 7,045,794 B1 | 5/2006 | Spallas et al. | |
| 7,101,592 B2 | 9/2006 | Gueggi et al. | |
| 7,129,592 B1 * | 10/2006 | Yetter | 290/1 A |
| 7,152,985 B2 | 12/2006 | Benitez et al. | |
| 7,160,522 B2 | 1/2007 | Minano Dominguez et al. | |
| 7,181,378 B2 | 2/2007 | Benitez et al. | |
| 7,388,147 B2 | 6/2008 | Mulligan et al. | |
| 7,394,016 B2 | 7/2008 | Gronet | |
| 2001/0008230 A1 | 7/2001 | Keicher et al. | |
| 2002/0056473 A1 | 5/2002 | Chandra et al. | |
| 2002/0060208 A1 | 5/2002 | Liu et al. | |
| 2002/0127953 A1 * | 9/2002 | Doan et al. | 451/41 |
| 2002/0148497 A1 | 10/2002 | Sasaoka et al. | |
| 2002/0149107 A1 | 10/2002 | Chang et al. | |
| 2002/0154396 A1 | 10/2002 | Overbeck | |
| 2003/0015820 A1 | 1/2003 | Yamazaki et al. | |
| 2003/0095175 A1 | 5/2003 | Agorio | |
| 2003/0129810 A1 | 7/2003 | Barth et al. | |
| 2003/0201581 A1 | 10/2003 | Weber et al. | |
| 2003/0213429 A1 * | 11/2003 | Kreuzer | 118/322 |
| 2003/0232174 A1 | 12/2003 | Chang et al. | |
| 2004/0012676 A1 | 1/2004 | Weiner | |
| 2004/0031517 A1 | 2/2004 | Bareis | |
| 2004/0048001 A1 * | 3/2004 | Kiguchi et al. | |
| 2004/0070855 A1 | 4/2004 | Benitez et al. | |
| 2004/0084077 A1 | 5/2004 | Aylaian | |
| 2004/0151014 A1 | 8/2004 | Speakman | |

| | | | |
|---|---|---|---|
| 2004/0191422 | A1 | 9/2004 | Kataoka |
| 2004/0200520 | A1 | 10/2004 | Mulligan et al. |
| 2004/0211460 | A1 | 10/2004 | Simburger et al. |
| 2005/0000566 | A1 | 1/2005 | Posthuma et al. |
| 2005/0029236 | A1 | 2/2005 | Gambino et al. |
| 2005/0034751 | A1 | 2/2005 | Gross et al. |
| 2005/0046977 | A1 | 3/2005 | Shifman |
| 2005/0067729 | A1 | 3/2005 | Laver et al. |
| 2005/0081908 | A1 | 4/2005 | Stewart |
| 2005/0133084 | A1 | 6/2005 | Joge et al. |
| 2005/0194037 | A1 | 9/2005 | Asai |
| 2005/0221613 | A1 | 10/2005 | Ozaki et al. |
| 2005/0253308 | A1 | 11/2005 | Sherwood |
| 2006/0046269 | A1* | 3/2006 | Thompson et al. ............ 435/7.1 |
| 2006/0076105 | A1 | 4/2006 | Furui et al. |
| 2006/0207650 | A1 | 9/2006 | Winston et al. |
| 2006/0231133 | A1 | 10/2006 | Fork et al. |
| 2006/0251796 | A1* | 11/2006 | Fellingham |
| 2006/0266235 | A1 | 11/2006 | Sandhu et al. |
| 2008/0047605 | A1 | 2/2008 | Benitez et al. |
| 2008/0138456 | A1 | 6/2008 | Fork et al. |

FOREIGN PATENT DOCUMENTS

| | | |
|---|---|---|
| CN | 2606309 Y | 3/2004 |
| CN | 1854637 A | 11/2006 |
| DE | 197 35 281 A1 | 2/1999 |
| EP | 0 257 157 A | 3/1988 |
| EP | 0 851 511 A | 7/1998 |
| EP | 1 145 797 A | 10/2001 |
| EP | 1351318 A | 10/2003 |
| EP | 1 715 260 A | 10/2006 |
| EP | 1 763 086 A | 3/2007 |
| EP | 1 787 786 A | 5/2007 |
| EP | 1 833 099 A | 9/2007 |
| JP | 60082680 A | 5/1985 |
| JP | 02055689 A | 2/1990 |
| JP | 02 187291 A | 7/1990 |
| JP | 2002-111035 A | 4/2002 |
| JP | 2004-266023 A | 9/2004 |
| JP | 2005051216 | 2/2005 |
| WO | WO 91/08503 A | 6/1991 |
| WO | WO 91/15355 | 10/1991 |
| WO | WO 92/15845 A | 9/1992 |
| WO | WO 94/28361 A1 | 12/1994 |
| WO | WO 97/21253 A | 6/1997 |
| WO | WO 97/48519 A | 12/1997 |
| WO | WO 00/49421 A1 | 8/2000 |
| WO | WO 00/49658 A1 | 8/2000 |
| WO | WO 00/50215 | 8/2000 |
| WO | WO 02/052250 A | 7/2002 |
| WO | WO 02/097724 A1 | 12/2002 |
| WO | WO 03/047005 A | 6/2003 |
| WO | WO 03/076701 A | 9/2003 |
| WO | WO 2005/070224 A1 * | 8/2005 |
| WO | WO 2005/107957 A1 * | 11/2005 |
| WO | WO 2005/107958 A1 * | 11/2005 |
| WO | WO 2006/097303 A | 9/2006 |
| WO | WO 2007/104028 | 9/2007 |

OTHER PUBLICATIONS

MacDonald et al. "Texturing industrial multicrystalline silicon solar cells," Solar Energy, vol. 76, 2004, pp. 277-283.

Tool et al. "Straightforward in-line processing for 16.8% efficient mc-Si solar cells," 31st IEEE Photovoltaic Specialists Conf., Florida, 2005, pp. 1324-1327.

Fukui et al. "17.7% efficiency large area multicrystalline silicon solar cell using screen-printed metallization technique," 31st IEEE Photovoltaic Specialists Conf., Florida, 2005, pp. 979-982.

Mitsubishi Electric Corp., Mitsubishi Electric Develops Practical-Use Multi-Crystalline Silicon Solar Cell with World's Highest Conversion Efficiency Rate of 18.6%, News Release #2432, Tokyo, Mar. 19, 2008, Available URL: http://global.mitsubishielectric.com/news/news_releases/2008/mel0705.pdf.

Zhao et al. "19.8% efficient 'honeycomb' textured multicrystalline and 24.4% monocrystalline silicon solar cells," Applied Physics Letters, vol. 73, pp. 1991-1993, 1998.

Abbott et al. "Optical and Electrical Properties of Laser Texturing for High-efficiency Solar Cells," Progress in Photovoltaics: Research and Applications, Published online Jan. 5, 2006, vol. 14, pp. 225-235, 2006.

Murphy, Jr. "Home photovoltaic systems for physicists," *Physics Today*, Jul. 2008, pp. 42-47.

Alvarez et al. "RXI Concentrator for 1000X Photovoltaic Energy Conversion".

Benitez et al. "High-Concentration Mirror-Based Kohler Integrating System for Tandem Solar Cells", WCPEC2006, 4 pages.

Bett et al. "FLATCON™ and FLASHCON™ Concepts for High Concentration PV", Presented at the 19th European Photovoltaic Solar Energy Conf., Jun. 7-11, 2004, Paris, 4 pages.

Gordon et al. "Optical performance at the thermodynamic limit with tailored imaging designs", Applied Optics, *in press*, Dec. 2004, 16 pages.

Kenis et al. "Fabrication inside Microchannels Using Fluid Flow", Accounts of Chemical Research, vol. 33, No. 12, 2000, pp. 841-847.

Mulligan et al. "A Flat-Plate Concentrator: Micro-Concentrator Design Overview", 2000 IEEE, pp. 1495-1497.

Mulligan et al. "Development of Chip-Size Silicon Solar Cells".

Nguyen, Luu "Wafer Level Packaging for Analog/Mixed Signal Applications", MEPTEC Int. Wafer Level Packaging Conference, Aug. 22, 2002, 41 pages.

Sun et al. "Modeling and Experimental Evaluation of Passive Heat Sinks for Miniature High-Flux Photovoltaic Concentrators", Transactions of the ASME, vol. 127, pp. 138-145 (2005).

Sundararajan et al. "Three-Dimensional Hydrodynamic Focusing in Polydimethylsiloxane (PDMS) Microchannels", Journal of Microelectromechanical Systems, vol. 13, No. 4, Aug. 2004, pp. 559-567.

Swanson, Richard M. "The Promise of Concentrators", *Prog. Photovolt. Res. Appl.* 8, pp. 93-111 (2000).

Terao et al. "A Mirror-Less Design for Micro-Concentrator Modules", Conference Record of the 28th IEEE Photovoltaic Specialists Conference (2000) pp. 1416-1419.

Terao, Akira "MicroDish: A Novel Reflective Optic for Flat-Plate Micro-Concentrator", SPIE's 49th Annual Meeting, Aug. 2-6, 2004, Denver, Colorado, USA, 9 pages.

Brogren et al. "Optical properties, durability, and system aspects of a new aluminum-polymer-laminated steel reflector for solar concentrators", Jan. 2004, Solar Energy Materials and Solar Cells, 82, pp. 387-412.

Mauk et al. "'Buried' Metal/Dielectric/Semiconductor Reflectors for Light Trapping in Epitaxial Thin-Film Solar Cells", May 1996, IEEE, 25th PVSC, pp. 147-150.

Munzer et al. "Thin Monocrystalline Silicon Solar Cells, Oct. 1999, IEEE Transactions on Electron Devices", vol. 46, No. 10, pp. 2055-2061.

U.S. Appl. No. 11/282,882, filed Nov. 17, 2005, Fork et al.
U.S. Appl. No. 11/282,829, filed Nov. 17, 2005, Fork et al.
U.S. Appl. No. 11/336,714, filed Jan. 20, 2006, Fork et al.

Cousins et al. "Manufacturing and Design Issues for Thin Silicon Solar Cells Manufactured on FZ(B), MCZ(B), CZ(Ga) and CZ(B) Wafers", IEEE, pp. 987-990, 2005.

Cuevas et al. "50 Per Cent More Output Power from an Albedo-Collecting Flat Panel Using Bifacial Solar Cells", *Solar Energy*, vol. 29, No. 5, pp. 419-420, 1982.

Finlayson et al. "$Bi_2O_3$-$Wo_3$ compounds for photocatalytic applications by solid state and viscous processing", Title from a conference scheduled for Oct. 6-7, 2004 in Munich, 8 pages.

Kerschaver et al. "Back-contact Solar Cells: A Review," Progress in Photovoltaics: Research and Applications, 2006, vol. 14, pp. 107-123.

Kränzl et al. "Bifacial Solar Cells on Multi-Crystalline Silicon", 15th International Photovoltaic Science & Engineering Conference, Shanghai, China, 2 pages, 2005.

Mueller et al. "Breathable Polymer Films Produced by the Microlayer Coextrusion Process", Journal of Applied Polymer Science, vol. 78, pp. 816-828, 2000.

Neuhaus et al. "Industrial Silicon Wafer Solar Cells," Advances in OptoElectronics, vol. 2007, 2007, 15 pages.

Rao et al. "Microfabricated Deposition Nozzles for Direct-Write Assembly of Three-Dimensional Periodic Structures", *Advanced Materials*, vol. 17, No. 3, Feb. 10, 2005, 5 pages.

Recart et al. "Large Area Thin BSF Solar Cells With Simultaneously Diffused Boron and Phosphorus Screen Printed Emitters", IEEE, pp. 1213-1216, 2005.

Taguchi et al. An Approach for the Higher Efficiency in the HIT Cells, IEEE, pp. 866-871, 2005.

Van Hoy et al. "Microfabrication of Ceramics by Co-extrusion", *J. Am. Ceram. Soc.*, vol. 81, No. 1, pp. 152-158, 1998.

Weber et al. "Modelling of Sliver® Modules Incorporating a Lambertian Rear Reflector", The Australian National University, Canberra ACT 0200, Australia, 4 pages, 2005.

Gimac Compact Triplex TR12 Micro-Coextrusion Plant, NPE 2000, Jun. 19-23, 2000, McCormick Place, Chicago, IL, Booth 13154, http://www.citsco.com/NPE2000/npepagel.html, 2 pages.

Extrusion/Coextrusion Dies, Extrusion Dies Industries, LLC, http://www.extrusiondies.com/PRODUCTS/ExtrusionDies/multimanifoldDies.html, 1 page.

Hitachi: Offering Total Environmental Solutions, Environmental Activities, http://greenweb.hitachi.co.jp/en/sustainable/total-solution.html, 5 pages, 2003.

Sanyo Solar Panels, Sanyo HIT Solar Panel Discount—Solar Electric Supply, Sanyo Solar Modules, http://www.solarelectricsupply.com/Solar_Panels/Sanyo/sanyo.html, 4 pages, 2005.

SunPower Corp. News Release, May 12, 2008, Available URL: http://investors.sunpowercorp.com/releasedetail.cfm?ReleaseID=309613.

Schweizer, Peter M. "Curtain Coating Technology Can Mean Big Benefits," Paper, Film & Foil Converter website, Mar. 1, 2000, 5 pages, http://pffc-online.com/mag/paper_curtain_coating_technology.

Nijs et al. "Overview of solar cell technologies and results on high efficiency multicrystalline silicon substrates," Solar Energy Materials and Solar Cells, vol. 48, No. 1-4, Nov. 1, 1997, pp. 199-217.

Knight et al. "Hydrodynamic Focusing on a Silicon Chip: Mixing Nanoliters in Microseconds", Physical Review Letters, vol. 80, No. 17, Apr. 27, 1998, pp. 3863-3866.

Raabe et al. "High Aspect Ratio Screen Printed Fingers", 20th European Solar Energy Conference and Exhibition, Barcelona, Spain, Jun. 6-10, 2005, 4 pages.

Bejan, A. "Chapter Five, Buckling Flows: A New Frontier in Fluid Mechanics," Annual Review of Numerical Fluid Mechanics and Heat Transfer, vol. 1, Ed. T. C. Chawla, Hemisphere Publishing Corporation, 1987, pp. 262-304.

Liang et al. "Co-Extrusion of Solid Oxide Fuel Cell Functional Elements", Ceramic Engineering and Science Proceedings, vol. 20, No. 4, 1999, pp. 587-594.

Shannon et al. "The Production of Alumina/Zirconia Laminated Composites by Co-Extrusion", Ceramic Engineering and Science Proceedings, vol. 16, No. 5, 1955, pp. 1115-1120.

Kenis et al. "Microfabrication Inside Capillaries Using Multiphase Laminar Flow Patterning", Science, vol. 285, Jul. 2, 1999, pp. 83-85.

Szlufcik et al. "Low-Cost Industrial Technologies of Crystalline Silicon Solar Cells", Proc. of the IEEE, vol. 85, No. 5, May 1, 1997, pp. 711-730.

Ruffle et al. "Etching of CuInSe2 Thin Films-Comparison of Femtosecond and Picosecond Laser Ablation", Applied Surface Science, vol. 247, No. 1-4, Jul. 15, 2005, pp. 447-452.

\* cited by examiner

WIRING-FREE, PLUMBING-FREE, COOLED, VACUUM CHUCK

FIELD OF THE INVENTION

The present invention pertains to large scale production methods, and more particularly to the large scale fabrication of solar cells using self-contained (i.e., wiring-free and plumbing-free) vacuum chucks that hold and cool the solar cell wafers during the fabrication process.

BACKGROUND OF THE INVENTION

Vacuum chucks are devices that are used to secure semiconductor (e.g., monocrystalline silicon) wafers during processing by, for example, photolithographic stepper machines. Conventional vacuum chucks typically include a flat, air permeable support surface positioned over a vacuum chamber. During operation, a wafer is placed on the support surface, and air pressure inside the vacuum chamber is reduced by way of a centralized vacuum pump. The low pressure inside the vacuum chamber pulls the wafer against the support surface such that a lower surface of the wafer blocks air flow through the support surface, whereby the wafer is securely held in an extremely flat position on the vacuum chuck. The vacuum chuck is then passed through one or more processing stations in which the upper (exposed) surface of the wafer is subjected to one or more fabrication processes (e.g., the deposition of a resist layer, photolithographic exposure of the resist layer, development of the exposed photoresist layer, and removal of exposed/unexposed photoresist material). Once processing is completed, pressure inside the vacuum chamber is increased to facilitate removal of the processed wafer, a new (unprocessed) wafer is mounted and secured to the vacuum chuck in the manner described above, and then the fabrication processes are repeated.

A problem with conventional vacuum chuck arrangements is that they are not conductive to high volume wafer processing. Conventional systems sometimes use a succession of vacuum chucks connected by pressure hoses to a central vacuum source, with the wafers passed from one vacuum chuck to the next at each step of the process. A problem with this approach is that it requires frequent mounting and dismounting of the delicate wafers from the various vacuum chucks, which results in increasing cumulative positional error, increased losses due to wafer damage, and can also produce undesirable temperature variations. The mounting and remounting problem can be avoided by using a single vacuum chuck to carry each wafer through several processing stations, but this would greatly decrease processing throughput. A "conveyor belt" series of vacuum chucks could be arranged to move multiple wafers through the system, but this approach is greatly complicated by the hoses and wiring connected to each vacuum chuck. In some cases a rotary stage with vacuum chucks fixed to it is used. The plumbing is simplified by a single rotary joint in the line. However, this approach does not allow for the linear motion required for extruding straight lines on a wafer passing under a print head, as is required by the solar cell fabrication process described below. Nor does it allow a large number of steps to the process without a prohibitively large table.

An additional problem arises when a fabrication process requires that the wafer be cooled. One such process is described below in the fabrication solar cell devices having extruded high aspect ratio gridlines, wherein the extrusion process requires rapid cooling of the extruded materials when they contact the solar cell wafer. A practical approach to achieving this cooling function is to cool the support surface of each vacuum chuck. Utilizing conventional practices similar to those used to produce vacuum pressure, such cooling would be achieved by providing a central cooling system, and passing the coolant to the various vacuum chucks by way of associated plumbing. However, such as solution would greatly complicate the already difficult process of coordinating the movement of the vacuum chucks without tangling the coolant distribution plumbing.

What is needed is a method and apparatus that facilitates the efficient, high volume production of solar cells and having high aspect ratio extruded gridlines. In particular, what is needed is a vacuum chuck production system that both reliably holds and cools solar cell wafers during the extrusion of high aspect ratio gridlines in a way that avoids the wiring and plumbing problems associated with conventional vacuum chuck systems.

SUMMARY OF THE INVENTION

The present invention is directed to a method and apparatus that facilitates the efficient, large scale production of, for example, solar cells having high aspect ratio extruded gridlines by providing a self-contained (i.e., wire-free and plumbing-free) vacuum chuck that both holds and cools the solar cell wafers during the fabrication process. That is, rather than utilizing a centralized vacuum pump and cooling system with the associated wiring and plumbing, as in conventional vacuum chuck systems, the present invention utilizes multiple self-contained vacuum chucks, each having its own local vacuum pump and a closed-loop cooling system, that are transported along a production line by a conveyor belt. After each wafer is processed, it is removed from its vacuum chuck, and the vacuum chuck is returned to the start of the production line by a second conveyor belt. By incorporating such self-contained vacuum chucks into the assembly line, the present invention greatly simplifies the solar cell fabrication process by facilitating high volume processing of solar cell wafers without having to account for wiring and plumbing connected to each vacuum chuck.

In accordance with an aspect of the invention, each of the self-contained vacuum chucks includes a local power supply for driving that vacuum chuck's vacuum pump and cooling system. In one embodiment the local power supply comprises an inductive power supply that is inductively coupled to an external source during operation. In one specific embodiment, when the vacuum chuck is located in a processing station (e.g., an apparatus for extruding high-aspect ratio gridlines), the inductive power supply is inductively coupled to an external alternating current source by way of a coil, thus inducing current that is used to power the vacuum pump and cooling system, and also to recharge an optional battery. In this way, the vacuum chuck is externally powered while in each processing station, and is powered from the battery during hand-off between adjacent processing stations.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in large scale fabrication methods used in the production of solar cells that utilizes self-contained vacuum chucks. The following description is presented to enable one of ordinary skill in the art to make and use the invention as provided in the context of a particular application and its requirements. As used herein, directional terms such as "upper", "upwards", "lower", "downward", "front", "rear", are intended to provide relative positions for purposes of description, and are not intended to designate an absolute frame of reference. In addition, the phrase "integrally connected" is used herein to describe the connective relationship between two portions of a single molded or machined structure, and are distinguished from the terms "mounted", "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
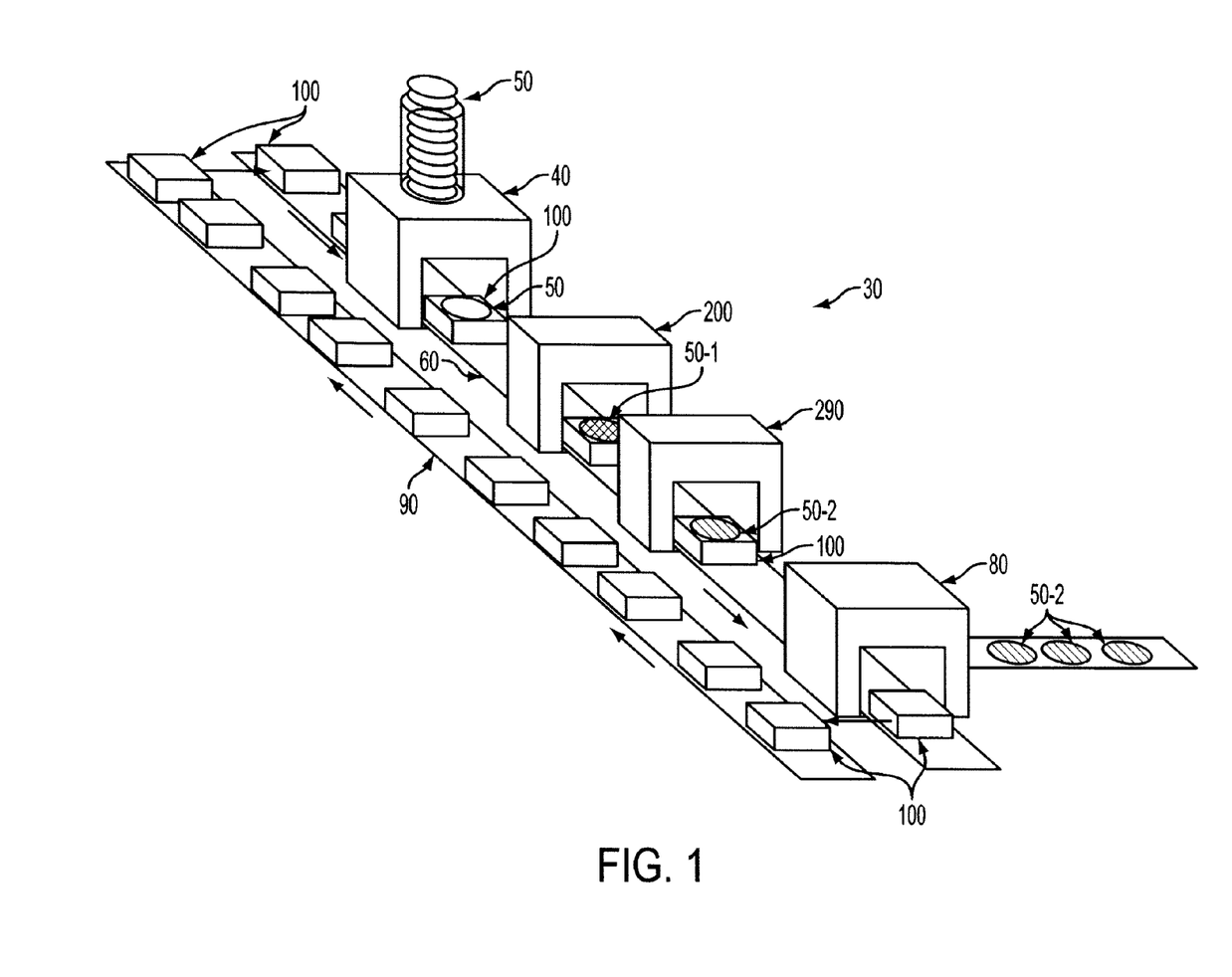
FIG. 1 is a perspective view showing a simplified production system that utilizes self-contained vacuum chucks according to an embodiment of the present invention.

FIG. 1 is a perspective view showing a simplified production system 30 for facilitating the efficient, large scale production of wafer-based products (e.g., integrated circuits (ICs) and solar cells). Production system 30 generally includes a wafer loading apparatus 40 for loading (i.e., non-processed) wafers 50 onto vacuum chucks 100, a first conveyor 60 for conveying vacuum chucks 100 along a production line including one or more processing stations (e.g., an extrusion apparatus 200 and an etching tool 290), an off-loading station 80 for removing processed wafers 50-2 from vacuum wafers 100, and a return (second) conveyor 90 for returning vacuum chucks 100 to wafer loading station 40. In one embodiment, wafers 50 are de-skewed and fixed to an assigned vacuum chuck 100 by wafer loading apparatus 40 using known techniques. The combined vacuum chucks/wafers 100/50 are then passed from process to process down the production line. Throughout the production line, each vacuum chuck 100 is passed through a succession of processing "stations", such as extrusion apparatus 200. These stations may be fixed, or may move through a short repeatable path (e.g. one station might be used to move the wafer under a print-head, as described below).

Figure 2:
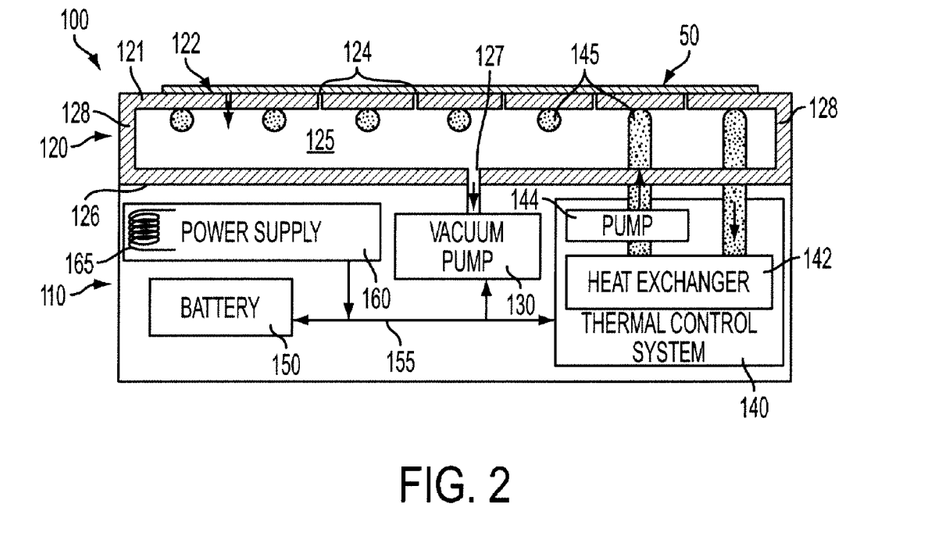
FIG. 2 is a simplified cross-sectional side view showing a self-contained vacuum chuck utilized in the production system of FIG. 1.
Figure 3:
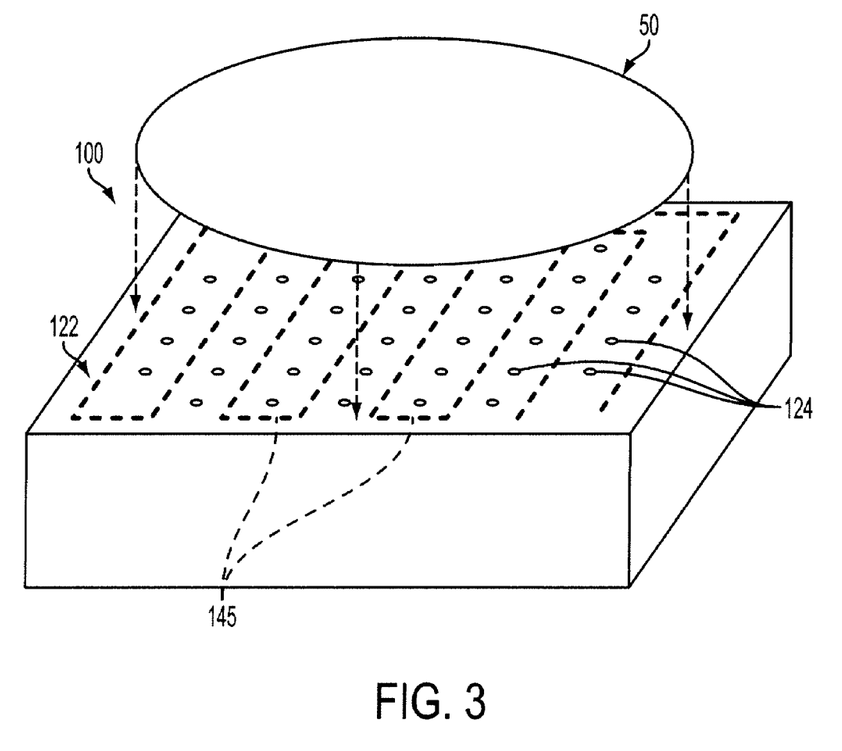
FIG. 3 is a perspective view showing the vacuum chuck of FIG. 2.

FIGS. 2 and 3 are cross-sectional side and perspective top views, respectively, showing an exemplary portable vacuum chuck 100 for holding a wafer 50 during the fabrication process depicted in FIG. 1. In accordance with the present invention, vacuum chuck 100 is a self-contained apparatus constructed on a chuck body 110, which is a rigid frame other box-like structure formed from a suitable rigid material (e.g., steel, aluminum or plastic), and includes a support structure 120 disposed at an upper end of chuck body 110, and a vacuum pump 130, a thermal control (e.g., cooling or heating) system 140 and a power supply (i.e., a battery 150 and/or an inductive power source 160) that are mounted on chuck body 110 below support structure 120. A control system (not shown) including, for example, a couple of optical sensors, is used to synchronize control of on-board pumps, etc with the chuck's stage in the process.

Support structure 120 is integrally connected or otherwise fixedly connected to an upper end of chuck body 110, and includes an upper wall 121 having a support surface 122 defining multiple inlet holes 124, a lower wall 126 defining an outlet hole 127, and side walls 128 that combine with upper wall 121 and lower wall 126 to define a vacuum chamber 125 that is disposed below support surface 122. Inlet holes 124 pass entirely through upper wall 121 to facilitate communication (e.g., air flow) between support surface 122 and vacuum chamber 125. Vacuum pump 130 is an electrical pump that, during operation draws (sucks) air from vacuum chamber 125 through outlet hole 127. The relatively low pressure thus generated in vacuum chamber 125 draws air through inlet holes 124 (i.e., in the absence of wafer 50). When wafer 50 is placed on support surface 122, the lower surface of wafer 50 blocks inlet holes 124, and the low pressure generated inside vacuum chamber 125 creates a suction that holds wafer 50 against support surface 122. One or more non-fixturing actuators (not shown) are optionally provided on upper wall 121 to properly orient and position wafer 50 over inlet holes 124. Such non-fixturing actuators may be controlled using mechanical or electrical power, or using differential air pressure.

In accordance with an embodiment of the present invention, thermal control (e.g., heating or cooling) system 140 is provided to regulate environmental aspects of (e.g., heat or cool) contact surface 122. In a specific embodiment, which is utilized to facilitate the production of high-aspect ratio grid lines on wafer 50 in accordance with the process described below, thermal control system 140 comprises a cooling system that is used to cool contact surfaces 122. In this embodiment, cooling system 140 is a thermoelectric apparatus that is mounted inside chuck body, and includes a heat exchanger 142 and a pump 144 that pumps a fluidic coolant received from heat exchanger 142 through coolant ducts 145 that are disposed on a lower surface of upper wall 121 (in an alternative embodiment, coolant ducts 145 are integrally connected to upper wall 121). During operation, heat exchanger 142 receives relatively hot coolant from coolant ducts 145 and cools the liquid coolant using known techniques. The cooled coolant is then pumped back into coolant ducts 145 by pump 144. As indicated in FIG. 3 by the thick dashed lines, coolant ducts 145 are arranged to transmit the coolant over the entire area of upper plate 121 in a way that maintains the required temperature during processing performed on wafer 50. Note that the simplified duct pattern indicated in FIG. 3 is exemplary and not intended to be limiting. In other embodiments (not shown), thermal control system 140 comprises a heater including a heating coil or other means for heating a fluid that is passed through ducts 145, or for otherwise controlling environmental aspects of a substrate during processing.

Referring again to FIG. 2, in accordance with another aspect of the present embodiment, each vacuum chuck 100 includes local power supply 160 that, in one embodiment, utilizes a coil 165 for inductive coupling to an external source (not shown) during operation. In one specific embodiment, when each vacuum chuck 100 is located adjacent to a processing station (e.g., extrusion apparatus 200; see FIG. 1), inductive power supply 160 is inductively coupled to an external alternating current source provided at the processing station by way of coil 165, thus allowing inductive power supply 160 to provide a current on wire 155 that is used to power vacuum pump 130 and cooling system 140, whereby vacuum pump 130 functions to generate low pressure in vacuum chamber 125, and cooling system 140 functions to cool support surface 121. In one embodiment, the inductive coupling involves providing coils (not shown) at each processing station that are driven by an alternating current. In another possible embodiment, a series of permanent magnets are positioned along production line 60, and vacuum chucks 100 are moved along production line through the magnetic fields generated by the permanent magnets at a rate sufficient to drive inductive power supply 160. By utilizing inductive power supply 160 in this manner to transmit power to vacuum pump 130 and cooling system 140, the present invention avoids the need to manage power cables connected to each vacuum chuck 100, thus greatly simplifying production system 30 (see FIG. 1). In one embodiment, the inductive current generated on wire 155 is also utilized to recharge battery 150. In this embodiment, vacuum chuck 100 is externally powered by way of inductive power supply 160 while in each processing station, and is powered from battery 150 during hand-off between adjacent processing stations.

Although the power supply utilized by vacuum chuck 100 is described in the specific embodiment as involving inductive coupling to an external source, other methods for generating power in vacuum chuck 100 may also be used. For example, instead of inductive coupling, a mechanical (physical) electrical connection may be provided at each station using, for example, pogo-pins that are positioned or otherwise deployed to contact conductive pads disposed on the external surface of each vacuum chuck 100. Alternatively, each power supply 160 may include a generator that is driven from an external electrical or mechanical source (e.g., by way of a rotating shaft that is coupled to the generator through an external fixture), whereby the generator produces the electrical power necessary to drive vacuum pump 130 and thermal control system 140.

Figure 4:
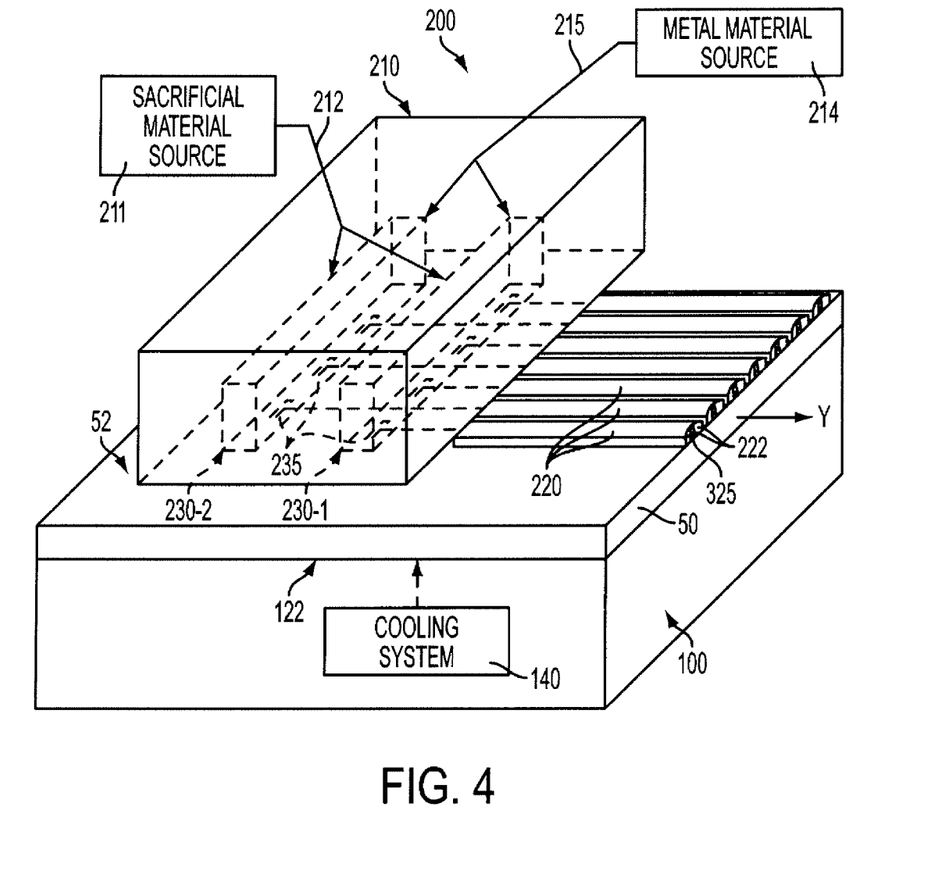
FIG. 4 is a perspective view showing a simplified extrusion apparatus utilized in the production system of FIG. 1.

FIG. 4 is a perspective view showing a simplified extrusion apparatus 200 that is utilized to produce solar cells in accordance with an embodiment of the present invention. Extrusion apparatus 200 includes an extrusion device 210 including one or more co-extrusion heads 230-1 and 230-2 fixedly mounted thereon that are utilized to produce solar cells in accordance with an embodiment of the present invention. Extrusion device 210 is coupled to a first source 211 containing a sacrificial material 212, and a second source 214 containing a gridline material 215. Extrusion heads 230-1 and 230-2 are operably coupled to sources 211 and 214 such that heads 230-1 and 230-2 concurrently apply sacrificial material 212 and a gridline material 215 onto the upper surface 52 of wafer 50, which is mounted on vacuum chuck 100 and conveyed under extrusion heads 230-1 and 230-2 in the direction of arrow Y, as shown in FIG. 4. Vacuum chuck 100 maintains wafer 50 such that outlet orifices 235 are maintained at a fixed distance from surface 52. While extrusion device 210 is being moved relative to wafer 50, gridline material 215 and sacrificial material 212 are co-extruded through outlet orifices 235 in a manner that creates parallel, elongated extruded structures 220 on surface 52 such that the gridline material of each structure 220 forms a high-aspect ratio gridline structure 325, and the sacrificial material of each structure 220 forms associated first and second sacrificial material portions 222 respectively disposed on opposing sides of the associated high-aspect ratio gridline 325. The shape of extruded structures 220 (i.e., the aspect ratio of gridline 325 and the shape of sacrificial portions 222) are controllable through at least one of the shapes of the one or more outlet orifices 235, the structure within the heads 230-1 and 230-2, characteristics of the materials (e.g., viscosity, etc.), and the extrusion technique (e.g., flow rate, pressure, temperature, etc.). The structure within heads 230-1 and 230-2 and the shape of outlet orifices 235 are described briefly below, and are described in additional detail in co-owned and co-pending U.S. patent application Ser. No. 11/555,479, entitled "CLOSELY SPACED, HIGH-ASPECT EXTRUDED GRIDLINES", which is incorporated herein by reference in its entirety.

As depicted in FIG. 4, to limit the tendency for the extruded materials to spread after extrusion, extruded structures 220 leaving extrusion heads 230-1 and 230-2 are quenched on wafer 50 by way of cooling system 140 provided on vacuum chuck 100. That is, wafer 50 is cooled through contact with contact surface 122, which in turn is cooled by cooling system 140 as described above. By providing cooling system 140 on vacuum chuck 100 such that it is powered by the on-board power supply, the present invention facilitates quenching of the extruded materials without requiring hoses or other plumbing required in conventional methods.

Figure 5A:
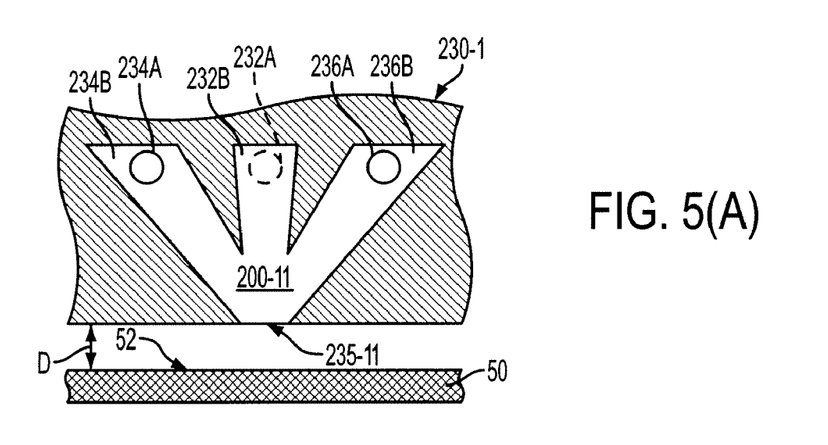
FIGS. 5(A) and 5(B) are cross-sectional side views showing a three-channel cavity formed in an extrusion cavity of the extrusion apparatus of FIG. 4.

FIG. 5(A) shows a portion of co-extrusion head 230-1 positioned over wafer 50 prior to generation of metal gridlines. Head 230-1 includes multiple plates that are bonded using known high pressure wafer bonding techniques to define three-channeled cavity 200-11. A first inlet port 232A is aligned with the closed end of a central channel 232B, and second and third inlet ports 234A and 236A are aligned with the closed ends of corresponding side channels 234B and 236B, respectively. As described below in additional detail, metal and sacrificial materials are introduced into three-channel cavity 231 through inlet ports 232A, 234A and 236A. Additional metal plates (not shown) may be utilized to conduct the metal and sacrificial materials to the inlet ports 232A, 234A and 236A in a manner that minimizes the number of material feedlines attached to each extrusion head. A method for fabricating head 230-1 is described in co-owned and co-pending U.S. patent application Ser. No. 11/555,512, entitled "EXTRUSION HEAD WITH PLANARIZED EDGE SURFACE", which is incorporated herein by reference in its entirety.

Figure 6:
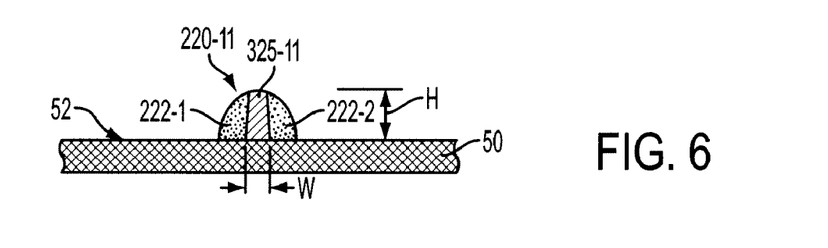
FIG. 6 is a cross-sectional side view showing an exemplary co-extruded gridline structure generated on a wafer surface by the co-extrusion head of FIG. 5(B)

Co-extrusion head 230-1 is maintained at a substantially fixed distance D over upper surface 52 of wafer 50 during the extrusion process (i.e., while co-extrusion head 230-1 is moved relative to wafer 50 in the manner described above). The distance D between the head 230-1 and the wafer 50 can be based on various factors, such as the angle of the dispensing end of the head 230-1 with respect to upper surface 52 (e.g., from parallel to perpendicular), in order to increase transfer efficiency, entity definition (e.g., width, height, length, diameter, etc), entity characteristics (e.g., strength, pliability, etc.), etc. Note that distance D must be greater than or equal to the height H (shown in FIG. 6) of extruded structure 220-11 in order to facilitate the staggered extrusion head arrangement shown in FIG. 4.

Figure 5B:
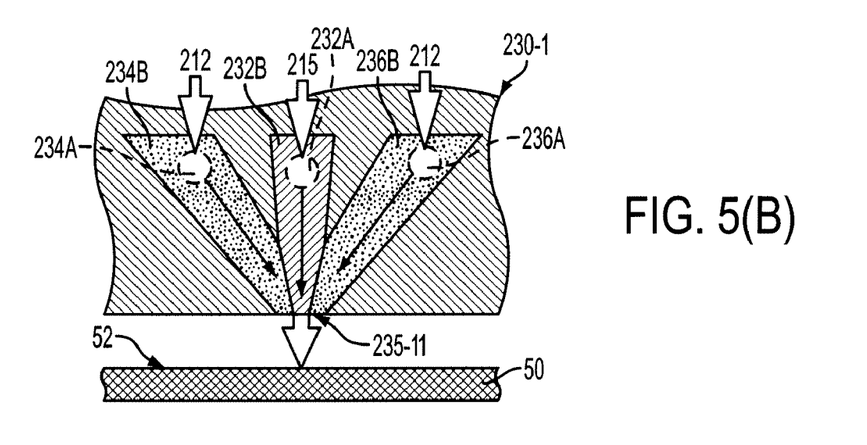

FIG. 5(B) shows the same portion of co-extrusion head 230-1 at the onset of the co-extrusion process. As indicated by the white arrows, gridline material 215 is forcibly injected through the first inlet port 232A into the closed end of central channel 232B, and sacrificial material 212 is simultaneously forcibly injected through inlet ports 234A and 236A into side channels 234B and 236B, respectively. As indicated by the dark arrows in FIG. 5(B), the injected materials travel downward along their respective channels. The gridline and sacrificial materials are compressed by the tapered shapes channels 232B, 234B and 236B. The gridline material is further compressed by the converging sacrificial material flowing along side channels 234B and 236B as the materials approach outlet orifice 235-11. The compressed flow is then extruded from outlet orifice 235-11 and is deposited on wafer 50 as extruded structure 220-11 (shown in FIG. 6). Intermixing between the gridline and sacrificial materials is minimized by choosing appropriate materials and viscosities, by appropriately tapering the channels, and/or by maintaining laminar flow conditions.

Figure 7:
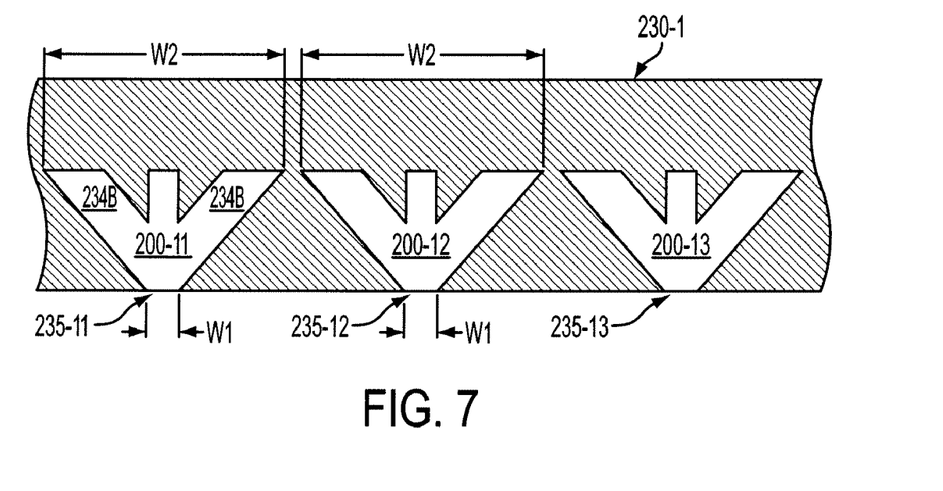
FIG. 7 is a cross-sectional side view showing a larger portion of the co-extrusion head of FIG. 4.
Figure 8:
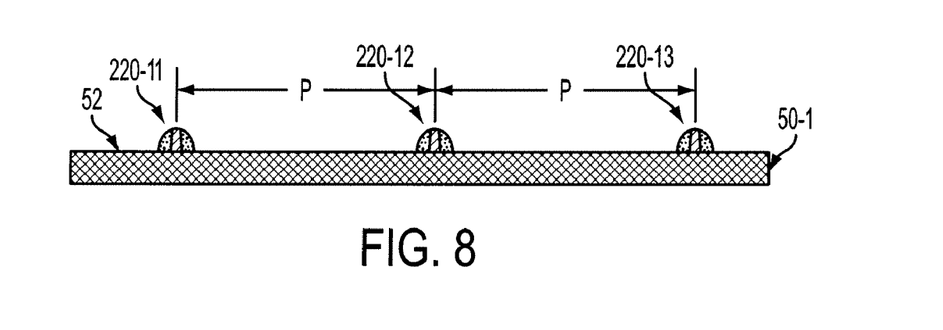
FIG. 8 is a cross-sectional side view showing a series of co-extruded gridline structures generated by the co-extrusion head of FIG. 7.
Figure 9:
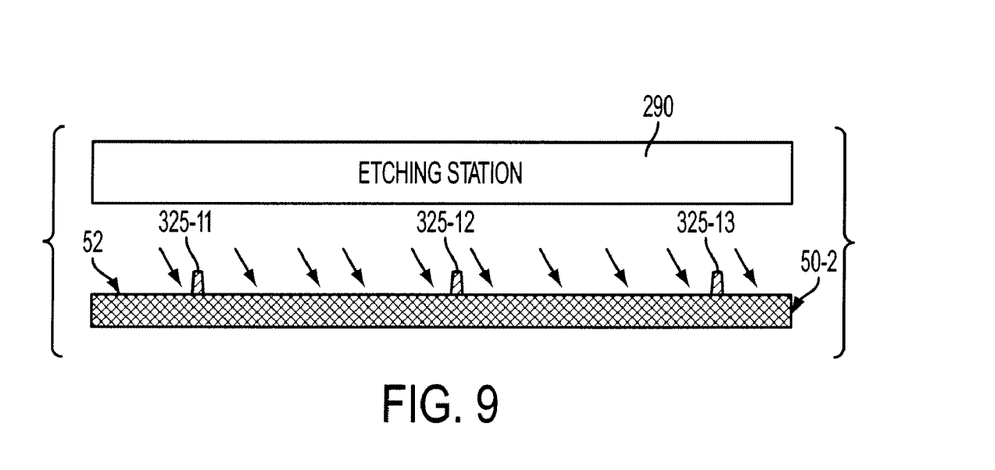
FIG. 9 is a cross-sectional view showing a plurality of metal gridlines formed on a wafer according to another aspect of the present invention.

FIG. 7 is a cross-sectional view showing a larger portion of extrusion head 230-1, and FIG. 8 depicts a series of extrusion structures 220-11, 220-12 and 220-13 that are produced extrusion head 230-1 in the manner described above. Referring briefly to FIG. 1, the wafers mounted on vacuum chucks 100 leaving extrusion apparatus 200 have extrusion structures 220-11, 220-12 and 220-13 formed thereon, and are referred to herein as wafers 50-1. FIG. 9 is a cross-sectional side view depicting the removal of sacrificial material (e.g., using a suitable etchant or firing, as indicated by slanted lines), which leaves high aspect-ratio gridlines 325-11, 325-12 and 325-13 on surface 52. Referring to FIG. 1, this etching process is performed at etching station 290, and the wafers mounted on vacuum chucks 100 leaving etching station 290 having high aspect-ratio gridlines 325-11, 325-12 and 325-13 formed thereon are referred to herein as wafers 50-2.

Figure 10:
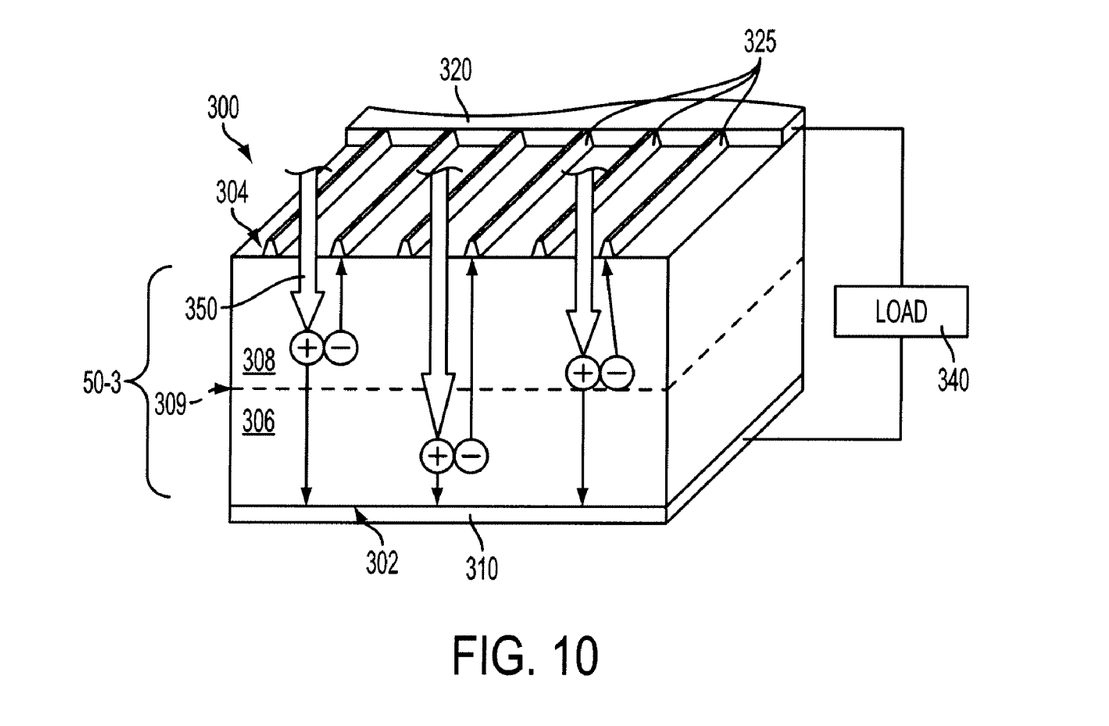
FIG. 10 illustrates a photovoltaic cell including gridlines formed in accordance with the present invention.

FIG. 10 illustrates an exemplary portion of a photovoltaic cell 300, such as a solar cell, with high-aspect metal gridlines 325 created via co-extrusion head 230-1. Photovoltaic cell 300 includes a semiconductor substrate 50-3 (where "50-3" is used to indicate that the substrate is generated from wafer 50-2 after further processing) with a p-type region 306 and an n-type region 308. One or both of the regions 306 and 308 of substrate 50-3 is formed from semiconductor materials such as, for example, Aluminium Arsenide, Aluminium Gallium Arsenide, Boron Nitride, Cadmium Sulfide, Cadmium Selenide, Copper Indium Gallium Selenide, Diamond, Gallium Arsenide, Gallium Nitride, Germanium, Indium Phosphide, Silicon, Silicon Carbide, Silicon Germanium, Silicon on insulator, Zinc Sulfide, Zinc Selenide, etc. A lower contact 310 is formed on a lower surface 302 of substrate 50-3 (i.e., at a lower end of p-type region 306). Metal gridlines 325 and one or more bus bars 320 are formed on an upper surface 304 of substrate 50-3 (i.e., at a lower end of n-type region 308). Contact 310 and bus bars 320 can be formed using a metal paste such as a silver-based or an aluminum-based paste.

Photovoltaic cell 300 can be interconnected with other photovoltaic cells (not shown) in series and/or parallel, for example, via flat wires or metal ribbons, and assembled into modules or panels and connected as indicated to a load 340. A sheet of tempered glass (not shown) may be layered over the gridlines 325 and/or a polymer encapsulation (not shown) may be formed over the contact 310. Upper surface 304 may include a textured surface and/or be coated with an antireflection material (e.g., silicon nitride, titanium dioxide, etc.) in order to increase the amount of light absorbed into the cell.

During operation, when photons 350 (indicated by wide arrows) are directed into substrate 50-3 through upper surface 304, their energy excites electron-hole pairs therein, which subsequently freely move. In particular, absorption of a photon creates an electric current through the p-n junction (depicted by the migrating + and − charges). Electrical current is generated when excited electrons in the n-type region 308 travel through gridlines 325, bus bar 320, and the electrodes to external load 340 and back through the lower electrode and contact 310 to the p-type region 306.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A production system comprising:
a plurality of self-contained portable vacuum chucks, wherein each of the self-contained portable vacuum chucks includes a chuck body, a support structure disposed on the chuck body, the support structure including an upper wall having a support surface and defining a vacuum chamber that is disposed below the support surface, a vacuum pump mounted on the chuck body for generating a low pressure in the vacuum chamber, a thermal control system including ducts disposed on the upper wall of the support structure below the support surface, and a power supply mounted on the chuck body and coupled to the vacuum pump and the thermal control system, whereby the vacuum pump functions to generate said low pressure in the vacuum chamber and the thermal control system functions to regulate environmental aspects of the support surface in response to energy drawn from the power supply;
means for loading a plurality of wafers onto said plurality of self-contained vacuum chucks such that one of said plurality of wafers is disposed on the support surface of each of said plurality of self-contained portable vacuum chucks
a plurality of processing stations; and
means for sequentially conveying the plurality of self-contained portable vacuum chucks between the plurality of processing stations.

2. The production system of claim 1, further comprising means for off-loading the wafers from the plurality of self-contained portable vacuum chucks,
wherein said means for sequentially conveying comprises:
a first conveyor belt disposed between said means for loading and said means for off loading the wafers from the self-contained portable vacuum chucks, and
a second conveyor belt disposed between said means for off-loading the wafers and said means for loading said wafers.

3. The production system of claim 2,
wherein said plurality of processing stations comprises:
an extrusion apparatus including a sacrificial material source, a gridline material source, and a co-extrusion head including a plurality of three-channeled cavities, each said three-channeled cavity including a central channel communicating with said gridline material source and two side channels communicating with said sacrificial material source, said central channel and said two side channels of said plurality of three-channeled cavities being arranged such that, when gridline material is introduced into said co-extrusion head from said gridline material source and sacrificial material is introduced into said co-extrusion head from said sacrificial material source, said gridline material and said sacrificial material are co-extruded onto a target wafer of said plurality of wafers disposed under said extrusion head in a manner that creates parallel, elongated extruded structures on said target wafer, wherein the gridline material of each extruded structure includes a high-aspect ratio gridline structure, and the sacrificial material of said each structure forms associated first and second sacrificial material portions respectively disposed on opposing sides of the associated high-aspect ratio gridline, and means for removing the first and second sacrificial material portions.

4. The production system of claim 1, wherein each of the plurality of processing stations includes an associated power source, and wherein the power supply of each said self-contained portable vacuum chuck comprises inductive means for coupling to the power source when said each self-contained portable vacuum chuck is disposed adjacent to said each associated processing station such that power is transferred from said inductive means to said vacuum pump and said thermal control system.

5. The production system of claim 4, wherein the power supply of each said self-contained portable vacuum chuck further comprises means for supplying power to said self-contained portable vacuum pump and said thermal control system when said each vacuum chuck is disposed between said plurality of processing stations.

6. The production system of claim 1, wherein the ducts of each said self-contained portable vacuum chuck are disposed in the vacuum chamber, and wherein the thermal control system of said each self-contained portable vacuum chuck comprises a heat exchanger and a pump for circulating a coolant in the ducts.

7. The production system of claim 1, wherein the ducts are disposed in the vacuum chamber, and wherein the thermal control system comprises means for circulating a fluid in the ducts.

8. The production system of claim 1, wherein each of the plurality of processing stations includes an associated power source and a plurality of associated connectors coupled to the associated power source, and wherein the power supply of each said self-contained portable vacuum chuck comprises a battery for supplying power to said vacuum pump and said thermal control system of said each self-contained portable vacuum chuck, and contact pads disposed on an external surface of said each self-contained portable vacuum chuck and coupled to said battery, said contact pads being arranged such that, when said each self-contained portable vacuum chuck is disposed adjacent to one of said each associated processing station, the contact pads contact said plurality of associated connectors of said processing station such that power is transferred from said associated power source to said battery.

9. The production system of claim 1, wherein each of the plurality of processing stations includes an associated mechanical power source and an associated mechanical connector coupled to the associated mechanical power source, and wherein the power supply of each said self-contained portable vacuum chuck comprises means for driving said vacuum pump and said thermal control system using power supplied from said mechanical power source by way of said associated mechanical connector when said each self-contained portable vacuum chuck is disposed adjacent to one of said each associated processing station.

10. The production system of claim 1, wherein each of the plurality of processing stations includes an associated electrical power source and an associated connector coupled to the associated electrical power source, and wherein the power supply of each vacuum chuck comprises a generator disposed on said each self-contained portable vacuum chuck and arranged such that, when said each vacuum chuck is disposed adjacent to one of said each associated processing station, the generator contacts said associated connector of said processing station and is driven by said electrical power source such that power is transferred from said generator to said vacuum pump and said thermal control system.

* * * * *